United States Patent
Wu et al.

(10) Patent No.: US 6,428,719 B1
(45) Date of Patent: Aug. 6, 2002

(54) ETCHING PROCESS TO SELECTIVELY REMOVE COPPER PLATING SEED LAYER

(75) Inventors: Xuehua Wu, Union City; Wensen Li, Fremont; Si-Tuan Lam; Henry C. Chang, both of San Jose; Kochan Ju, Fremont; Jei-Wei Chang, Cupertino, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/487,454

(22) Filed: Jan. 19, 2000

(51) Int. Cl.$^7$ .................................................. C23F 1/00
(52) U.S. Cl. ........................................ 216/105; 216/22
(58) Field of Search ..................................... 216/105, 22

(56) References Cited

U.S. PATENT DOCUMENTS

| | | | |
|---|---|---|---|
| 5,304,284 A | 4/1994 | Jagannathan et al. | 156/666 |
| 5,639,509 A | 6/1997 | Schemmel | 427/130 |
| 5,800,726 A | 9/1998 | Cotte et al. | 216/108 |
| 5,847,227 A | * 12/1998 | Fujita et al. | 568/399 |
| 5,935,644 A | 8/1999 | Heim et al. | 427/116 |

* cited by examiner

*Primary Examiner*—Randy Gulakowski
*Assistant Examiner*—Shamm Ahmed
(74) *Attorney, Agent, or Firm*—George O. Saile; Stephen B. Ackerman

(57) ABSTRACT

Write head coils for magnetic disk systems are commonly formed through electroplating onto a seed layer in the presence of a photoresist mask. It is then necessary to remove the seed layer everywhere except under the coil itself. The present invention achieves this through etching in a solution of ammonium persulfate to which has been added the complexing agent 1,4,8,11 tetraazundecane. This suppresses the reduction of $Cu^{++}$ to Cu, thereby increasing the dissolution rate of copper while decreasing that of nickel-iron. Two ways of implementing this are described—adding the complexing agent directly to the ammonium persulfate and introducing the 1,4,8,11 tetraazundecane through a dipping process that precedes conventional etching in the ammonium persulfate.

8 Claims, 3 Drawing Sheets

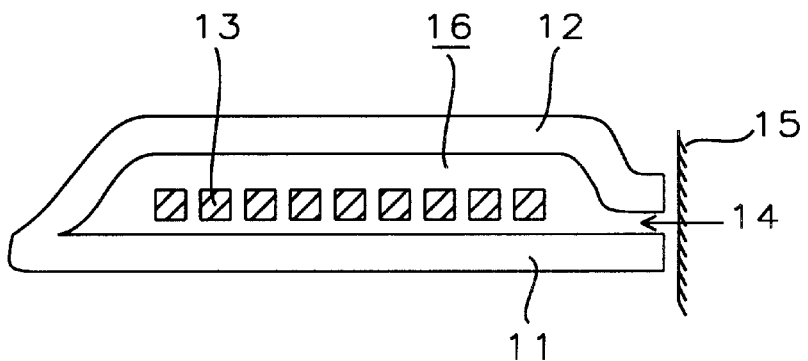
FIG. 1 - Prior Art
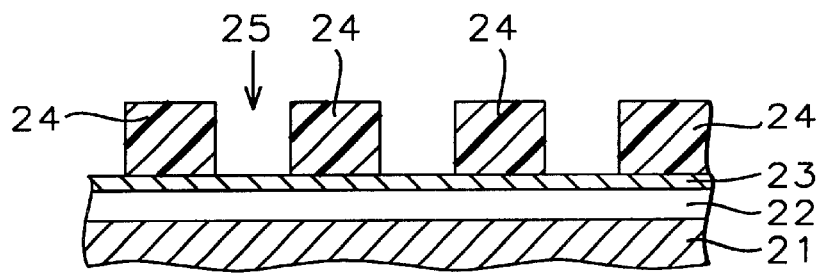
FIG. 2
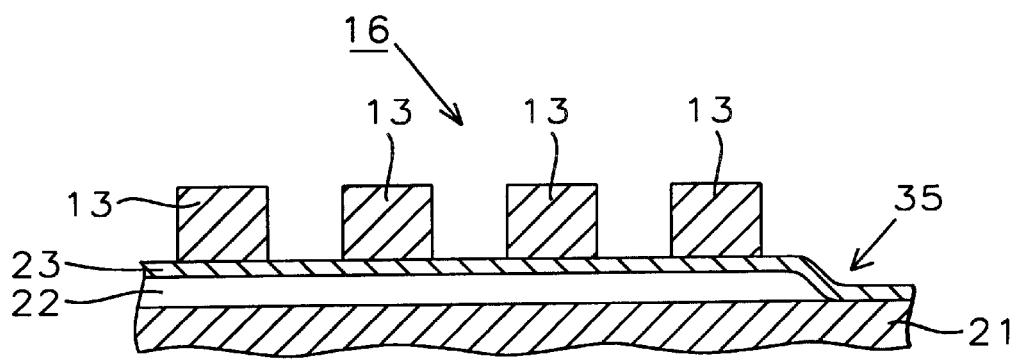
FIG. 3

ETCHING PROCESS TO SELECTIVELY REMOVE COPPER PLATING SEED LAYER

FIELD OF THE INVENTION

The invention relates to the general field of metal etching, particularly to etching copper in the presence of nickel-iron, and with particular application to the manufacture of write heads for magnetic disk systems.

BACKGROUND OF THE INVENTION

Referring to FIG. 1, we show, in schematic representation, a cross-sectional view of a write head for a magnetic disk system. The magnetic field needed to perform the write operation is generated by flat coil 16 made up of a number of turns (typically between about 8 and 18), where 13 is an example of one side of a single turn. Surrounding the flat coil is magnetic material comprising upper and lower pole pieces 12 and 11 respectively. These pole pieces are joined at one end (on the left in this figure) and are separated by small gap 14 at the other end. The magnetic field that is generated by flat coil 16 ends up being concentrated at gap 14. It is sufficiently powerful that the fringing field that extends outwards away from gap 14 is capable of magnetizing the magnetic storage medium over whose surface 15 the head 'flies'. The distance between gap 14 and surface 15 is typically between about 10 and 50 nm.

Clearly, flat coil 16 cannot be in direct contact with lower pole piece 11 so there is always a layer of insulating material (not shown in FIG. 1) between the coil and the lower pole piece. Since the coil is built up using electroplating, it is necessary to provide a conductive layer to act as a seed for the initiation of plating. Once the coil has been grown over this seed layer, the latter must be removed (except where it is directly under the coil) to avoid shorting out the coil.

Two general approaches to the problem of removing the seed layer are practiced in the prior art. The first is sputter etching. This approach is limited by the tendency for some of the sputter etched material to be re-deposited, so some shorting out of the coil remains a possibility. The second approach is to use chemical etching. In principle this overcomes the difficulties associated with sputter etching but this method, too, has associated difficulties. Unfortunately, etchants used to remove copper (notably ammonium persulfate) also attack permalloy (in particular, the nickel component of the permalloy), introducing the possibility of damaging the lower pole piece 11 during seed layer removal. This can happen because there is an ongoing possibility that some of the copper seed layer will be in direct contact with the lower pole piece. Such contact with the copper seed layer is possible because upper pole 12 must contact lower pole 11 at one end so it is convenient to initially plate it on the exposed area of lower pole 11. It is also necessary to electroform a copper stud near the device in order to make electrical wiring connection after the upper pole has been completed. Since the seed layer covers the whole wafer, there is direct contact of the copper seed layer on top of upper pole 12 which should be removed after stud plating. The present invention provides a solution to this problem.

A routine search of the prior art was performed but no processes similar to the exact process of the present invention were found. Several references of interest were, however, encountered. For example, U.S. Pat. No. 5,304,284 (Jagannathan et al.) shows a process for etching copper in the presence of more reactive metals. The method depends on the use of non-aqueous solutions and is based on creating a suitable balance between solutes of different oxidation potentials. One embodiment uses alkenes and alkynes as complexing agents.

In U.S. Pat. No. 5,800,726, Cotte et al. address the inverse problem to that solved by the present invention. i.e. it is the copper that is to be protected while other metals are being etched. Heim et al. (U.S. Pat. No. 5,935,644) show a pole and coil plating process while in U.S. Pat. No. 5,639,509 Schemmel teaches a process for forming a magnetic data transducer.

SUMMARY OF THE INVENTION

It has been an object of the present invention to provide a process for manufacturing a write coil for use in the write head of a magnetic disk system.

Another object of the invention has been to use electroplating on a seed layer and to subsequently remove said seed layer without affecting other materials that are close by, notably nickel-iron.

A further object of the invention has been that removal of the seed layer be accomplished by means of wet etching.

These objects have been achieved by removing the seed layer through etching in a solution of ammonium persulfate to which has been added the complexing agent 1,4,8,11 tetraazundecane. This suppresses the reduction of $Cu^{++}$ to Cu, thereby increasing the dissolution rate of copper while decreasing that of nickel-iron. Two ways of implementing this are described—adding the complexing agent directly to the ammonium persulfate and introducing the 1,4,8,11 tetraazundecane through a dipping process that precedes conventional etching in the ammonium persulfate.

BRIEF DESCRIPTION OF THE DRAWINGS

FIG. 1 is a schematic cross-section of a write head for a magnetic disk system.

FIG. 2 is the starting point for the process of the present invention showing a photoresist pattern on a copper seed layer.

FIG. 3 shows the structure of FIG. 2 after formation of the coil through electroplating.

DESCRIPTION OF THE PREFERRED EMBODIMENTS

Figure 4:
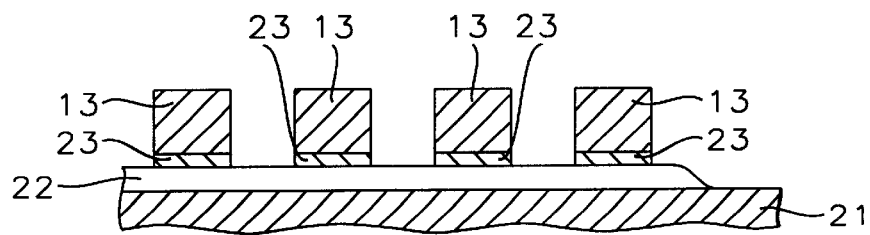
FIG. 4 shows the end product of the process of the present invention.

We begin a description of the process of the present invention at the point where a write coil (such as 16 in FIG. 1) is about to be formed. Referring now to FIG. 2, we show (in schematic cross-section) part of a body of nickel-iron 21. Most commonly, said body would be the upper portion of a lower pole piece (such as 11 in FIG. 1) but the invention is not limited to such hardware, being applicable to any nickel-iron body.

Insulating layer 22 is then deposited on the upper surface of body 21. Preferably, insulating layer 22 is photoresist that has been fully developed and then baked at a temperature between about 200 and 300° C. for between about 3 and 6 hours in nitrogen. The thickness of layer 22 is between about 0.5 and 4 microns. Note that the use of photoresist for layer 22 is not essential for the present invention to work and that other insulating materials such as aluminum oxide or magnesium oxide could also have been used.

With layer 22 in place, copper seed layer 23 is then laid down over insulating layer 22. Our preferred method for depositing 23 has been sputtering but other deposition methods such as evaporation or chemical vapor deposition (CVD) could also have been used without departing from the spirit of the invention. Layer 23 is between about 300 and 1,000 Angstroms thick.

Next, photoresist layer 24 is laid down on seed layer 23. Layer 24 must be thicker than the final thickness intended for the still-to-be-formed flat coil. Layer 24 is exposed to a suitable pattern and then developed so that it takes on the negative (inverse) image of the flat coil. This implies that the underlying seed layer is exposed in areas that define the coil and covered everywhere else. At this stage of the process the structure has the appearance seen in FIG. 2.

The step of forming the coil is illustrated in FIG. 3. By means of electroplating, the copper thickness is increased in all the exposed areas. The additional amount of copper that is added in this manner is between about 1 and 5 microns. Then, once the photoresist has been stripped away, the structure has the appearance shown in FIG. 3. Also illustrated in FIG. 3 is area 35 where insulating layer 22 has been penetrated by seed layer 35, bringing it into contact with nickel-iron body 21. As already discussed earlier, such breaching of layer 22 can come about because of connection between upper pole 12 and lower pole 11, as well as because of the stud plating process.

Once the stage illustrated in FIG. 3 has been reached, seed layer 23 needs to be removed everywhere except under the coil. This has to be achieved without affecting nickel-iron body 21 and the sub-process for accomplishing this constitutes the heart of the present invention. We now disclose two separate embodiments of said sub-process:

First embodiment

The structure, as shown in FIG. 3, is immersed in an aqueous etching solution of ammonium persulfate and 1,4,8,11 tetraazundecane for between about 4 and 50 seconds at a temperature between about 10 and 25° C. The concentration of the ammonium persulfate is between about 40 and 50 gms./liter while that of the 1,4,8,11 tetraazundecane is between about 01 and 1 gms./liter. Under these conditions the copper seed layer is fully removed while the nickel-iron is not affected, giving the structure the appearance illustrated in FIG. 4. Note that it is necessary that the pH of this etching solution be between about 12 and 14. If needed, this level of pH can be brought about through the addition of a suitable quantity of ammonium hydroxide.

Second embodiment

An alternative approach to that outlined above is to use a two stage process. First, the structure is dipped in an aqueous solution of 1,4,8,11 tetraazundecane, having a concentration between about 0.3 and 1.5 gms./liter, for between about 0.5 and 5 minutes at a temperature between about 17 and 25° C., and then immediately transferred to an aqueous etching solution of ammonium persulfate at a concentration of between about 40 and 50 gms./liter, where it is immersed for between about 5 and 50 seconds at a temperature between about 10 and 25° C. Under these conditions the copper seed layer is fully removed while the nickel-iron is not affected. It is necessary that the pH of the etching solution be between about 12 and 14 while that of the dip should be between about 6 and 14. If needed, these levels of pH can be brought about through the addition of a suitable quantity of ammonium hydroxide. If these conditions are met, the copper seed layer is fully removed while the nickel-iron is not affected, giving the structure the appearance illustrated in FIG. 4.

By way of explaining why the process of the present invention is effective in suppressing the dissolution of nickel-iron relative to copper we note that the dissolution of copper by ammonium persulfate is an oxidation reaction of the form

Figure 5:
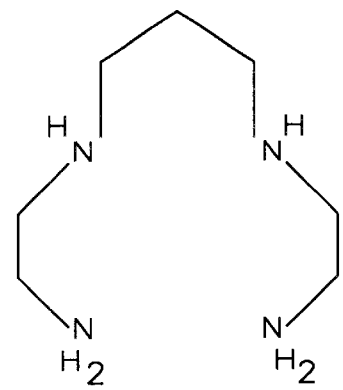
FIG. 5 shows the molecular structure of complexing agent 1,4,8,11 tetraazundecane.

so that any action that drives this reaction more to the right hand side will result in an increase in the dissolution rate of copper without affecting the dissolution rates of other materials present in the same solution. The action of the 1,4,8,11 tetraazundecane, whose molecular structure is illustrated in FIG. 5, is to serve as a complexing agent that keeps the $Cu^{++}$ ion in solution while at the same time making it unavailable for reduction, thereby keeping the active concentration of $[Cu^{++}]$ low.

Experimental confirmation of the above mechanism was obtained by plotting separate polarization curves for both copper and nickel-iron in ammonium persulfate, with and without the addition of the 1,4,8,11 tetraazundecane complexing agent. A polarization curve measures the corrosion exchange current and the corrosion potential by plotting Ig(I/A) vs. voltage applied between a metal electrode (in this case copper or nickel-iron) and a standard reference electrode (in this case a standard calomel electrode).

Figure 6:
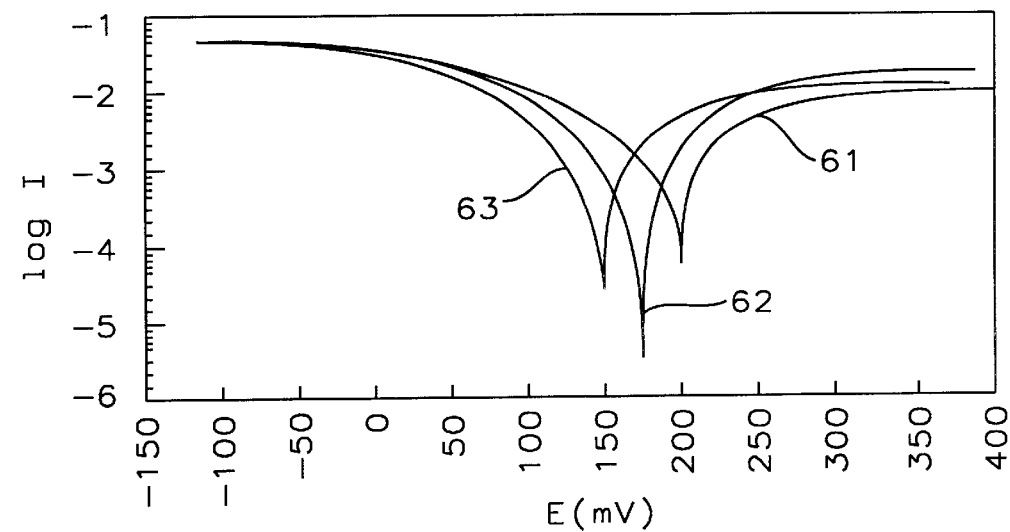
FIGS. 6 and 7 are polarization curves for copper and nickel-iron respectively plotted in ammonium persulfate solution with varying amounts of added 1,4,8,11 tetraazundecane.
Figure 7:
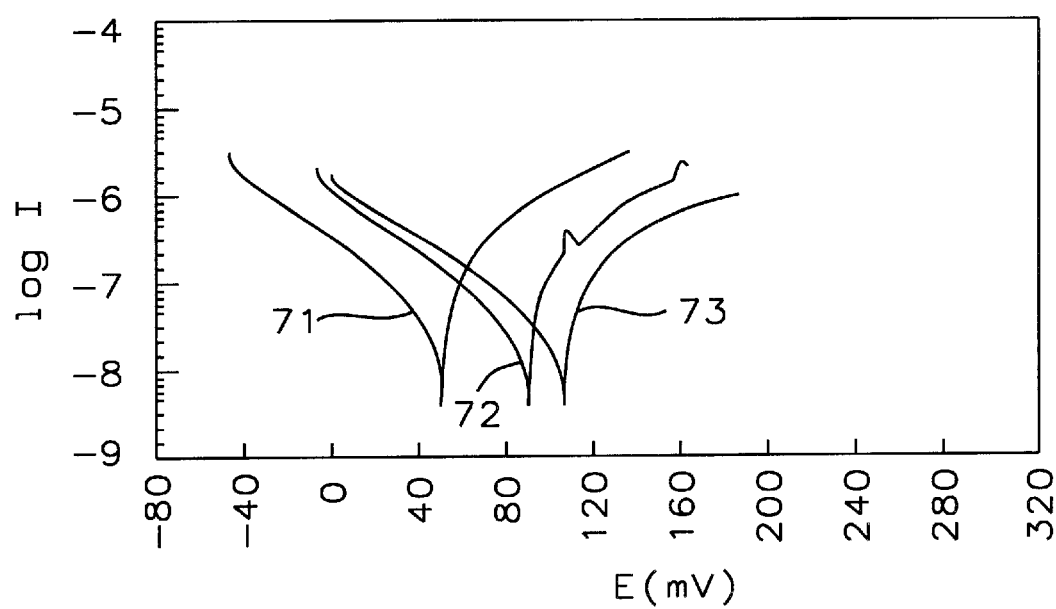

The results are shown in FIGS. 6 and 7 which are for copper and nickel-iron respectively. In FIG. 6, curve 61 is for pure ammonium persulfate while curves 62 and 63 are for ammonium persulfate with 0.3 g/liter and 0.6 g/liter, respectively, of added 1,4,8,11 tetraazundecane. In FIG. 7, curve 71 is for pure ammonium persulfate while curves 72 and 73 are for ammonium persulfate with 0.3 g/liter and 0.6 g/liter, respectively, of added 1,4,8,11 tetraazundecane. These results show that the addition of 1,4,8,11 tetraazundecane to the ammonium persulfate solution makes the copper potential more cathodic (moves it to the left) while it has the opposite effect on the nickel-iron.

Finally, we note that although the process of the present invention has been disclosed in terms of a specific complexing agent (1,4,8,11 tetraazundecane), it would be obvious to one skilled in the art to achieve similar results to those of the present invention by use of other, similar, complexing agents such as 1,5,9,13 tetraazatridecane or triethylene tetramine. So, while the invention has been particularly shown and described with reference to the preferred embodiments thereof, it will be understood by those skilled in the art that various changes in form and details may be made without departing from the spirit and scope of the invention.

What is claimed is:

1. A process for etching copper in the presence of nickel-iron, comprising:

providing a body of nickel iron and a layer of copper in the vicinity of the nickel-iron such that there is contact between the copper and the nickel-iron; and immersing the layer of copper and the body of nickel-iron in an aqueous etching solution of ammonium persulfate, at a first concentration, to which has been added 1,4,8,11 tetraazundecane at a second concentration, whereby said copper layer is removed and the nickel-iron is unaffected.

2. The process of claim 1 wherein the concentration of ammonium persulfate is between about 40 and 50 gms./liter.

3. The process of claim 1 wherein the concentration of 1,4,8,11 tetraazundecane is between about 0.1 and 1 gms./liter.

4. The process of claim 1 wherein said aqueous etching solution has a pH between about 12 and 14.

5. A process for pre-wetting copper prior to etching in the presence of nickel-iron, comprising:

provi ding a body of nickel iron and a layer of copper in the vicinity of the nickel-iron such that there is contact between the copper and the nickel-iron;

dipping the body having nickel-iron and copper in an aqueous solution of 1,4,8,11 tetraazundecane;

removing the body having nickel-iron and copper from said solution of 1,4,8,11 tetraazundecane; and immediately immersing the body having copper and nickel-iron in an aqueous etching solution of ammonium persulfate whereby said copper layer is removed and the nickel-iron is unaffected.

6. The process of claim 5 wherein the ammonium persulfate has a concentration in the etching solution of between about 40 and 50 gms./liter.

7. The process of claim 5 wherein the 1,4,8,11 tetraazundecane has a concentration in the aqueous solution of between about 0.3 and 1.5 gms./liter.

8. The process of claim 5 wherein said aqueous etching solution has a pH between about 12 and 14 and the aqueous solution of 1,4,8,11 tetraazundecane has a pH between about 6 and 14.

\* \* \* \* \*